US009859604B2

(12) United States Patent
Huang

(10) Patent No.: US 9,859,604 B2
(45) Date of Patent: Jan. 2, 2018

(54) BALUN FILTER AND RADIO-FREQUENCY SYSTEM

(71) Applicant: Wistron NeWeb Corporation, Hsinchu (TW)

(72) Inventor: Guo-Shu Huang, Hsinchu (TW)

(73) Assignee: Wistron NeWeb Corporation, Hsinchu (TW)

( * ) Notice: Subject to any disclaimer, the term of this patent is extended or adjusted under 35 U.S.C. 154(b) by 147 days.

(21) Appl. No.: 14/875,713

(22) Filed: Oct. 6, 2015

(65) Prior Publication Data

US 2016/0164160 A1 Jun. 9, 2016

(30) Foreign Application Priority Data

Dec. 9, 2014 (TW) ............................ 103142915 A

(51) Int. Cl.
*H03H 7/42* (2006.01)
*H01P 5/10* (2006.01)

(52) U.S. Cl.
CPC .................................... *H01P 5/10* (2013.01)

(58) Field of Classification Search
CPC .............. H01P 5/10; H01P 1/203; H03H 7/42
USPC ...................................... 333/26, 4, 202, 204
See application file for complete search history.

(56) References Cited

U.S. PATENT DOCUMENTS 4,983,937 A * 1/1991 Kinoshita .............. H03H 2/001 333/202
5,825,263 A * 10/1998 Falt ......................... H01P 1/201 333/204
6,762,660 B2 * 7/2004 Allison ............... H01P 1/20363 333/161
7,276,995 B2 * 10/2007 Hamada .............. H01P 1/20381 333/204
7,495,530 B2 * 2/2009 Shih .................... H01P 1/20381 333/202
7,573,355 B2 * 8/2009 Soora .................. H01P 1/20363 333/202
8,044,845 B2 10/2011 Saunders
8,305,283 B2 * 11/2012 Bourtoutian ........... H01Q 5/335 333/161
8,427,260 B2 * 4/2013 Satoh .................... H01P 1/2013 333/204
2013/0026846 A1 * 1/2013 Gianesello .......... H01F 27/2804 307/104
2013/0307640 A1 * 11/2013 Wada .................. H01P 1/20381 333/134

* cited by examiner

*Primary Examiner* — Dean Takaoka
(74) *Attorney, Agent, or Firm* — Winston Hsu

(57) ABSTRACT

A balun filter utilized for a radio-frequency (RF) system includes a first terminal coupled to an antenna of the RF system for delivering an RF signal; a differential port has a second terminal and a third terminal for delivering a differential signal; a band pass filter coupled between the first terminal and the differential port has a plurality of resonators, each including a surrounding line substantially surrounding an area and forming a loophole on a side of the each resonator; and at least a line segment connected to the surrounding line and disposed separately within the area surrounded by the surrounding line.

14 Claims, 9 Drawing Sheets

BALUN FILTER AND RADIO-FREQUENCY SYSTEM

BACKGROUND OF THE INVENTION

1. Field of the Invention

The present invention relates to a balun filter and a radio-frequency system, and more particularly, to a balun filter and a radio-frequency system capable of saving the entire area of the RF system.

2. Description of the Prior Art

In radio-frequency (RF) systems, signals transmitted and received by antennas are single-ended (unbalanced) signals, and signals processed by RF processing modules, following the RF systems, are differential (balanced) signals. Therefore, a balance-to-unbalance converter (Balun converter), coupled between an antenna and an RF processing module, is required to convert the balanced signals into the unbalanced signals, and vice versa. In addition, a band pass filter is usually coupled between an antenna and an RF processing module, for filtering out noise.

For example, FIG. 1 is a schematic diagram of an RF system 10 according to prior art. The RF system 10 includes an antenna 100, a band pass filter 102, a balun converter 104 and an RF processing module 106. When the RF system 10 functions as a receiver, the antenna 100 receives unbalanced RF signals from air, the band pass filter 102 filters noise outside of a specific frequency band, and the balun converter 104 converts the unbalanced signals into balanced signals. The balanced signals are inputted to the RF processing module 106 for further processing. When the RF system 10 functions as a transmitter, the RF processing module 106 generates an RF signal as a balanced differential signal. The balanced differential signal should be delivered to the balun converter 104 to be converted to an unbalanced signal. After the band pass filter 102 filter out noise, the RF signal is transmitted by the antenna 100 to the air.

In detail, as shown in FIG. 1, the balun converter 104 utilizes a rat-race coupler and a specific impedance matching resister for realizing balance-to-unbalance conversion. The band pass filter 102 includes multiple coupled lines, for filtering signals in a specific frequency band. In other words, the balun converter 104 and the band pass filter 102 are designed individually and connected together in series. However, when the balun converter 104 and the band pass filter 102 are connected in series, a problem of impedance match occurs, the system performance is reduced. In another perspective, in addition to the transmission line between the balun converter 104 and the band pass filter 102, both the balun converter 104 and the band pass filter 102 occupy a certain circuit area, such that the area where those components are disposed on is needed to be expanded. If the transmission line between the balun converter 104 and the band pass filter 102 is too long, a loss on transmission is increased, and the gain of the antenna will be reduced as well.

As can be seen from the above, in the prior art, designing the balun converter and the band pass filter individually and connecting the two together in series requires a larger area, increases the loss on transmission path, reduces antenna gain, and has impedance matching problem. Therefore, it is necessary to improve the prior art.

SUMMARY OF THE INVENTION

It is therefore a primary objective of the present invention to provide a balun filter and a radio-frequency system, to improve over disadvantages of the prior art.

An embodiment of the present invention discloses a balun filter, utilized in a radio-frequency (RF) system. The balun filter includes a first terminal, coupled to an antenna of the RF system, for delivering an RF signal; a differential port, including a second terminal and a third terminal, for delivering a differential signal; and a band pass filter, coupled between the first terminal and the differential port, the band pass filter including a plurality of resonators, each resonator including a surrounding line, substantially surrounding an area, and forming a loophole on a side of the each resonator; and at least one line segment, connected to the surrounding line, and disposed separately within the area surrounded by the surrounding line.

Another embodiment of the present invention further discloses a radio-frequency (RF) system, including an antenna, for transmitting or receiving an RF signal; a balun filter, including a first terminal, coupled to an antenna of the RF system, for delivering an RF signal; a differential port, including a second terminal and a third terminal, for delivering a differential signal; and a band pass filter, coupled between the first terminal and the differential port, the band pass filter including a plurality of resonators, each of the resonators including a surrounding line, substantially surrounding an area, and forming a loophole on a side of the each resonator; and at least one line segment, connected to the surrounding line, and disposed separately within the area surrounded by the surrounding line; and an RF processing module, coupled to the differential port, for receiving or generating the differential signal.

These and other objectives of the present invention will no doubt become obvious to those of ordinary skill in the art after reading the following detailed description of the preferred embodiment that is illustrated in the various figures and drawings.

DETAILED DESCRIPTION

To improve over disadvantages of prior art, the present invention provides a balun filter, which has functions of both balun conversion and filtering, so as to save the circuit area and avoid impedance matching problem between the balun converter and the filter.

Figure 1:
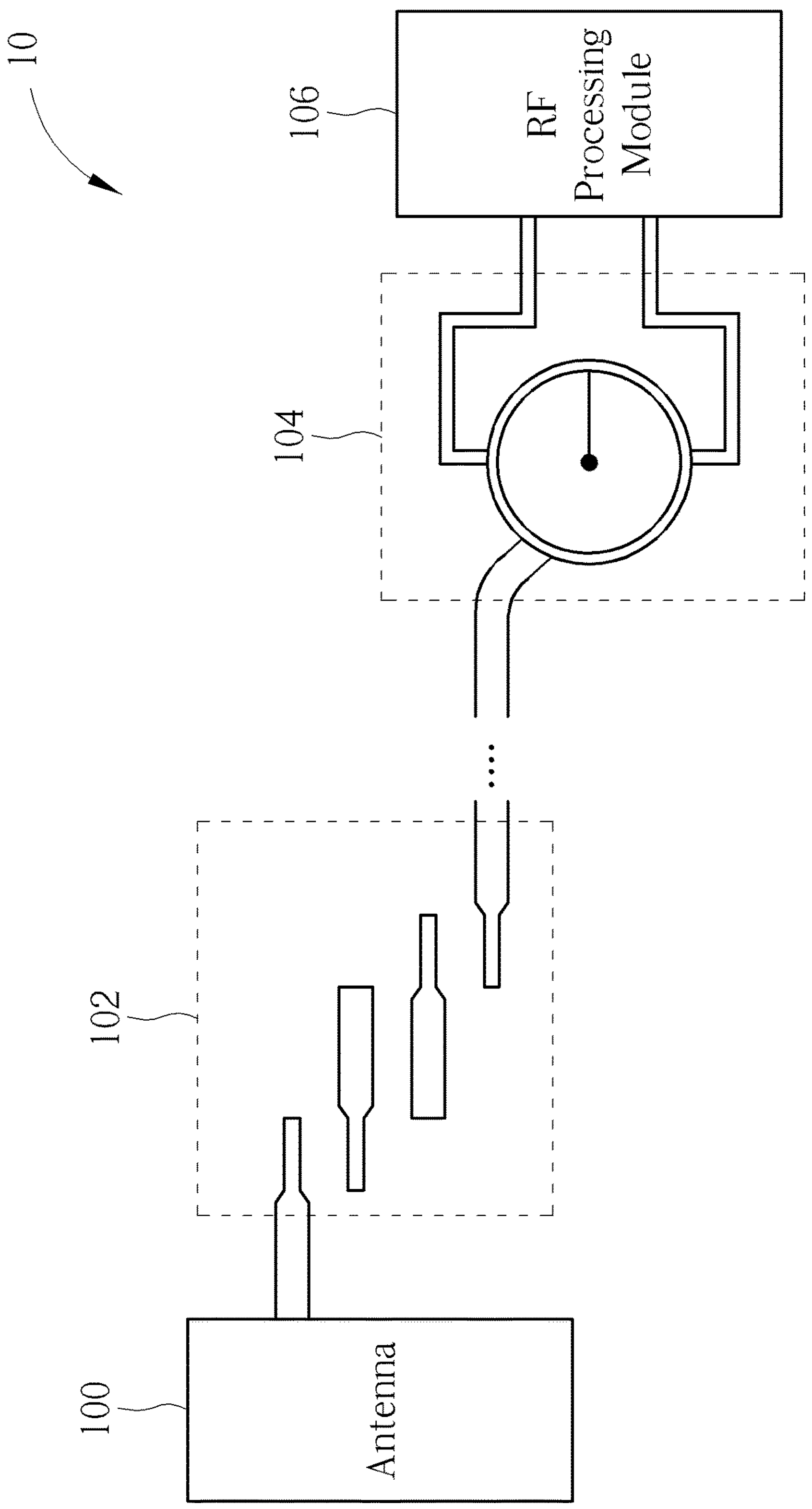
FIG. 1 PRIOR ART
FIG. 1 is a schematic diagram of a radio-frequency system according to prior art.
Figure 2:
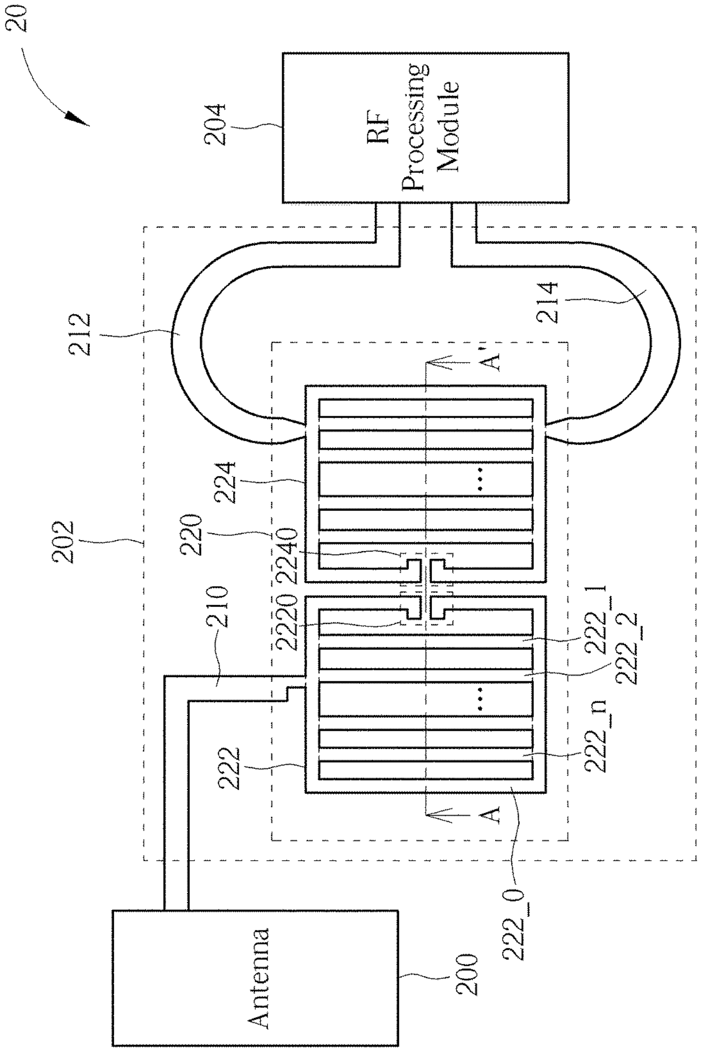
FIG. 2 is a schematic diagram of a radio-frequency system according to an embodiment of the present invention.

FIG. 2 is a schematic diagram of an RF system 20 according to an embodiment of the present invention. The RF system 20 includes an antenna 200, a balun filter 202 and an RF processing module 204. The balun filter 202 provides functionalities of both balance-to-unbalance conversion and filtering, and includes a first terminal 210, a second terminal 212, a third terminal 214 and a band pass filter 220. The balun filter 202 is coupled to the antenna 200 through the first terminal 210, for delivering a single-end RF signal. The second terminal 212 and the third terminal 214 of the balun filter 202 form a differential port, and are coupled between the band pass filter 220 and the RF processing module 204, for delivering a differential signal. In FIG. 2, the band pass filter 220 has a coupling resonance structure, and comprises resonators 222, 224. The resonators 222, 224 are arranged as a 1×2 array, and separated from each other to generate coupling effect. The resonators 222, 224 are symmetric with respect to a horizontal central line A-A'. For the convenience of explanation, in this embodiment, the resonators 222, 224 have the same structures and shapes, but are not limited thereto. Perimeters of the resonators 222, 224 are substantially corresponding to a half of wavelength of resonant frequency. Therefore, when signals from the first terminal 210 satisfy resonant conditions of the resonator 222, energy of the signals may be delivered to the resonator 224 by the coupling effect. Thus, a band pass filtering effect is achieved.

In detail, the first terminal 210 of the balun filter 202 is coupled to the resonator 222 of the band pass filter 220, and the second terminal 212 and the third terminal 214 are coupled to the resonator 224 the band pass filter 220. In another perspective, the band pass filter 220 is a fence-type filter, and a central frequency and a bandwidth of the fence-type filter may be finely adjusted under a main structure of the fence-type filter. Taking the resonator 222 as an example, the resonator 222 includes a surrounding line 222_0 and line segments 222_1~222_*n*. The surrounding line 222_0 substantially surrounds an area, and forms a loophole 2220 on a side. The line segments 222_1~222_*n* are disposed separately within the area surrounded by the surrounding line 222_0, and connected to the surrounding line. The line segments 222_1~222_*n* may be regarded as having parallel connections with a segment of the surrounding line 222_0, thereby letting the resonator 222 to be equivalent to a step impedance. When compared to a uniform impedance, a shorter perimeter of the resonator 222 is needed in regard with the step impedance. In other words, the fence-type filter may adjust central frequencies of the band pass filter 220 by changing the number of the line segments 222_1~222_*n*. For instance, the corresponding central frequency will be lowered as the number of the line segments 222_1~222_*n* increases. On the other hand, the gaps between the line segments 222_1~222_*n* are related to the bandwidth of the band pass filter 220. The narrower the gap is, the wider the bandwidth is. In addition, the structure of the resonators 222, 224 are symmetric with respect to the horizontal central line A-A', and the loophole 2220 of the resonator 222 and the loophole 2240 of the resonator 224 are aligned with each other. That is, the loophole 2220, 2240 of the resonators 222, 224 are located at the centers of adjacent sides of the resonators 222, 224, and locations of the second terminal 212 and the third terminal 214 of the balun filter 202 coupled to the resonator 224 are also symmetric with respect to the horizontal central line A-A'. Therefore, the balun filter 202 may utilize the symmetric structure of the resonators 222, 224 with respect to the horizontal central line A-A' to perform balance-to-unbalance conversion.

Operational principles of utilizing the symmetric structure to perform balance-to-unbalance conversion are explained as follow. In order to realize the function of balance-to-unbalance conversion and impedance matching of the balun filter 202, scattering parameters (S-parameters) are used to analyze the three-terminal of the balun filter 202, where the scattering parameters $S_{11}$, $S_{21}$, $S_{31}$ represent scattering parameters of the first terminal 210, the second terminal 212, and the third terminal 214 with respect to the first terminal 210, respectively. To achieve impedance matching, the scattering parameter $S_{11}$ of the balun filter 202 should be designed as zero (i.e., $S_{11}=0$). Meanwhile, to output balanced differential signal from the balun filter 202, that is, signals carried by the second terminal 212 and the third terminal 214 are two signals having equal energy and 180 degree phase difference (i.e., opposite phases), the scattering parameters $S_{21}$, $S_{31}$ should be designed to have opposite signs (i.e., $S_{21}=-S_{31}$). Therefore, a differential-mode reflection coefficient $\Gamma_1^d$, a differential-mode transmission coefficient $T_1^d$, a common-mode reflection coefficient $\Gamma_1^c$, a common-mode transmission coefficient $T_1^c$ of the balun filter 202 should satisfy:

$$\Gamma_1^d=\tfrac{1}{3},\ T_1^d=-\tfrac{2}{3}\sqrt{2}j,\ \Gamma_1^c=-1,\ T_1^c=0.$$

Since the balun filter 202 has the symmetric structure with respect to the horizontal central line A-A', the balun filter 202 may be designed using the equivalent half-circuit of the balun filter 202. In other words, designing an input impedance $Z_{in}^d$ of a differential-mode half-circuit of the balun filter 202 to be zero (i.e., $Z_{in}^d=0$) achieves $\Gamma_1^d=\tfrac{1}{3}$, so as to achieve input impedance matching. On the other hand, designing an input impedance $Z_{in}^c$ of a common-mode half-circuit of the balun filter 202 to be twice of a characteristic impedance (i.e., $Z_{in}^c=2Z_0$) achieves $\Gamma_1^c=-1$, so as to achieve balanced output (meaning that the signals at the second terminal 212 and the third terminal 214 have equal energy and opposite phase). Furthermore, $Z_{in}^d=0$ and $Z_{in}^c=2Z_0$ may be achieved by adjusting a feed-in location of the first terminal 210 coupled to the resonator 222. In such a situation, the balun filter 202 may have functions of impedance matching and outputting balanced signals. In addition to the band pass filter 220 of the balun filter 202, the balun filter 202 provides functions of balun converter and band pass filter, such that the entire area of the RF system 20 can be significantly reduced.

In short, the balun filter 202 of the present invention achieves the input impedance of the differential-mode half-circuit being zero and the input impedance of the common-mode half-circuit being twice of a characteristic impedance by adjusting the feed-in location of the first terminal 210 coupled to the resonator 222, so as to achieve impedance matching and balanced output. Moreover, the band pass filter 220 of the balun filter 202 is a fence-type filter, which means that the central frequency and bandwidth of the band pass filter 220 are adjusted by changing the number of the line segments and the gaps between the line segments of the fence-type filter. Therefore, the balun filter 202 provides functions of balun converter and band pass filter, such that the entire area of the RF system can be significantly reduced.

Figure 3:
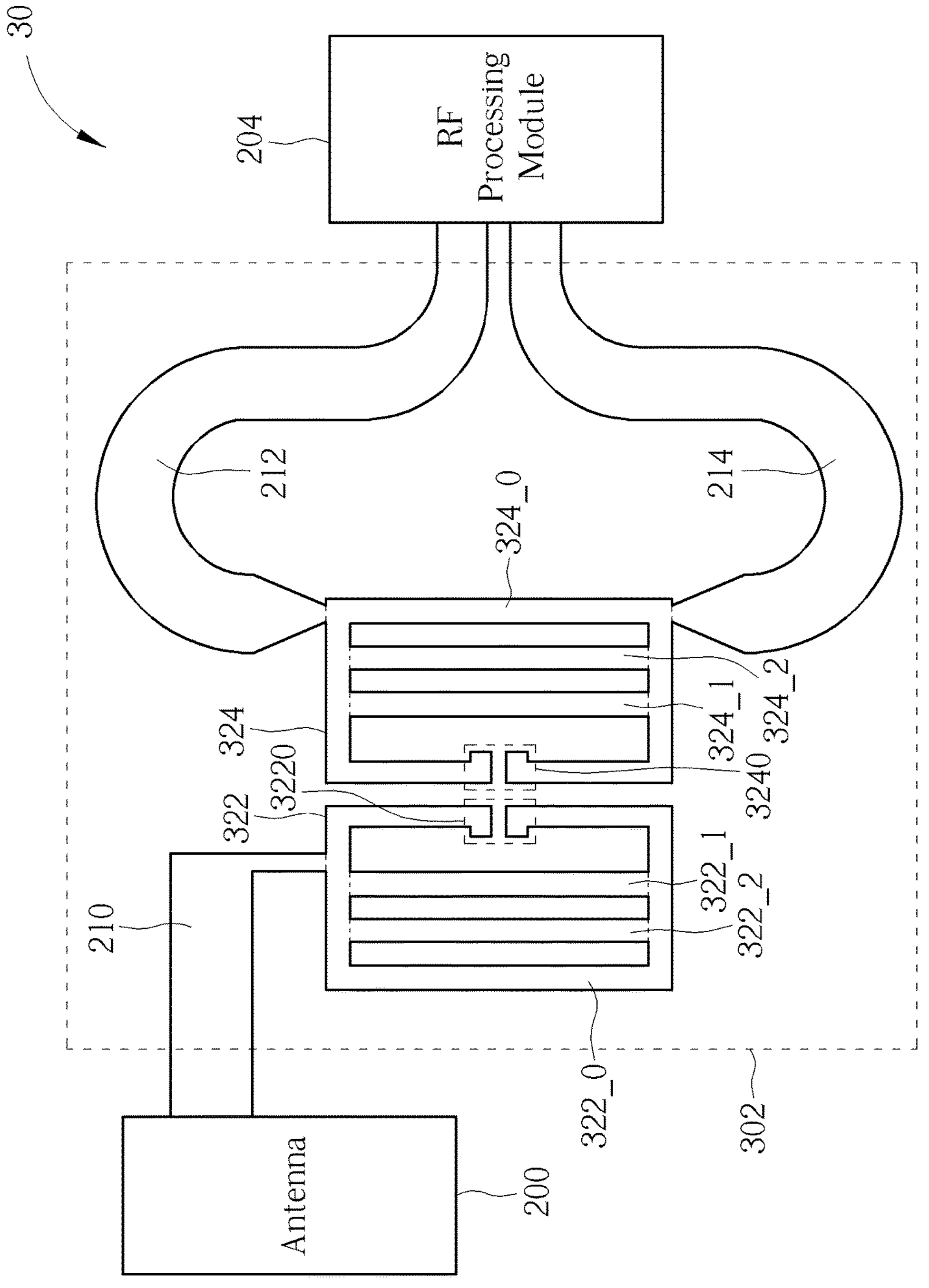
FIG. 3 is a schematic diagram of a radio-frequency system according to an embodiment of the present invention.
Figure 4:
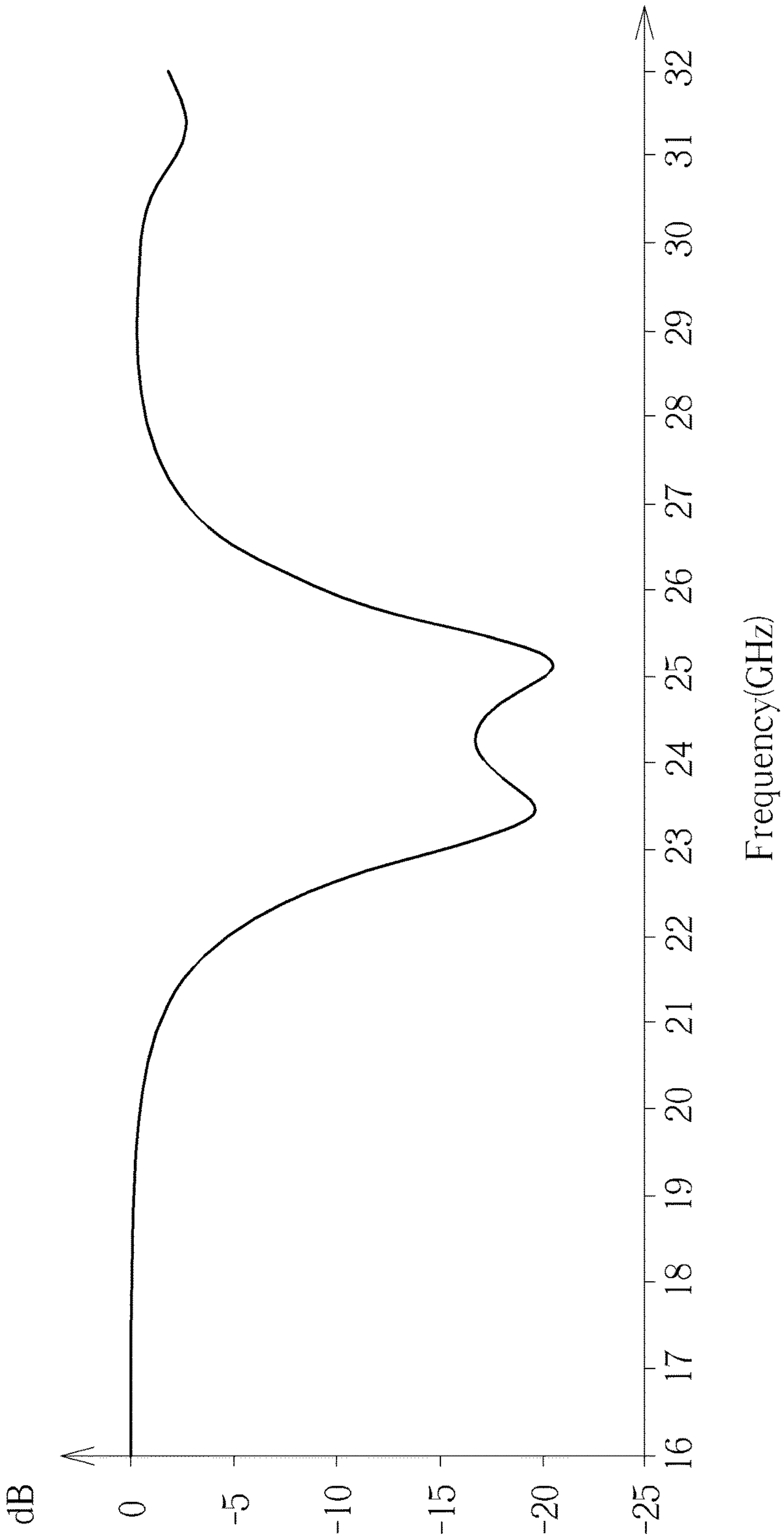
FIG. 4 is a schematic diagram of frequency responses of a reflection coefficient of the balun filter in FIG. 3.
Figure 5:
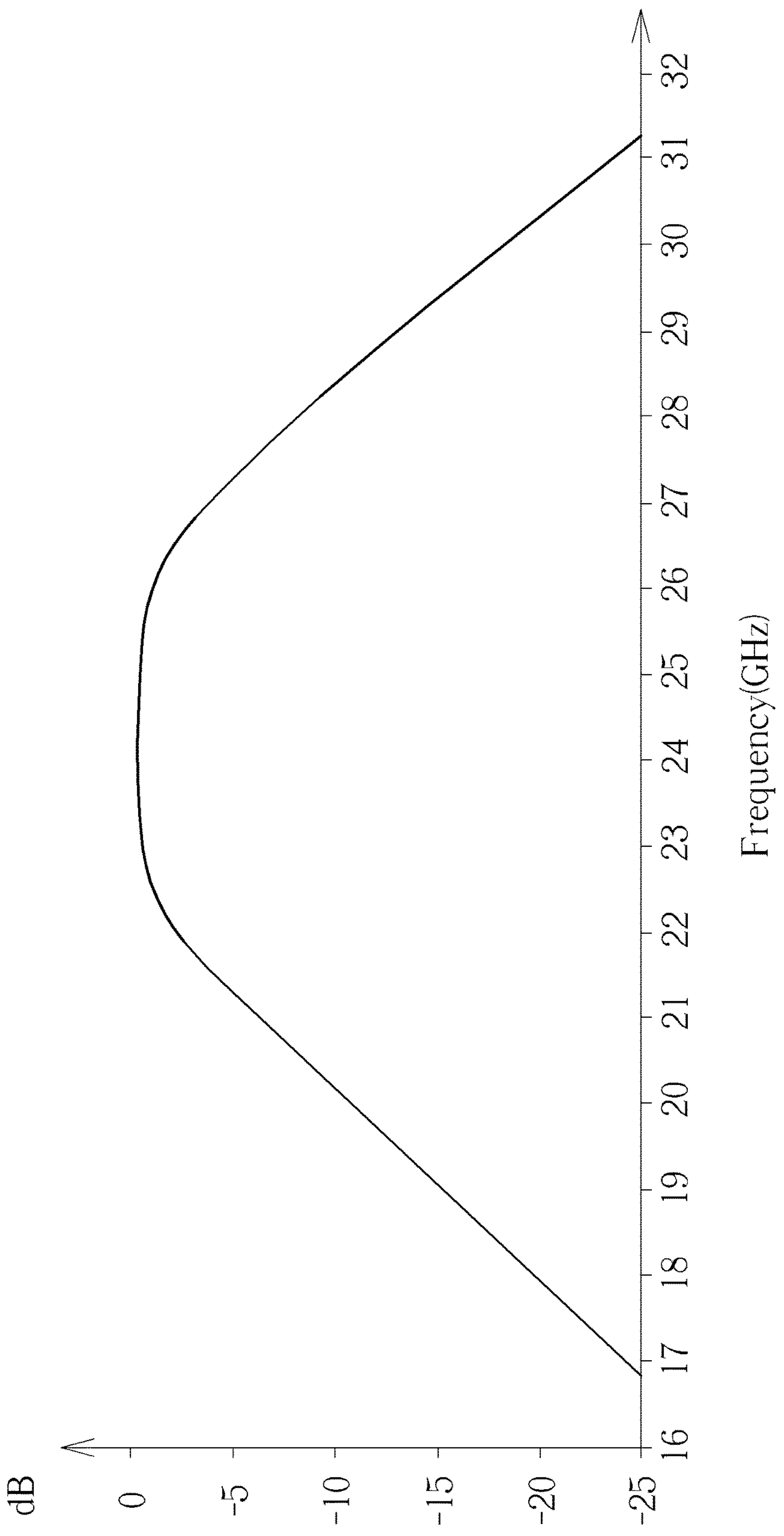
FIG. 5 is a schematic diagram of frequency responses of a transmission coefficient of the balun filter in FIG. 3.

For example, please refer to FIG. 3, which is a schematic diagram of an RF system according to an embodiment of the present invention. An operating frequency of the RF system 30 is substantially 24 GHz. The RF system 30 and the RF system 20 have similar structures, and thus, same components are denoted by the same numerals. Different from the RF system 20, resonators 322, 324 of a balun filter 302 of the RF system 30 includes line segments 322_1~322_2, 324_1~324_2, respectively. It means that each area surrounded by surrounding lines 322_0, 324_0 contains two line segments, so as to satisfy the resonant condition for the balun filter 302 of which operational frequency is substantially at 24 GHz. Frequency responses of a reflection coefficient and a transmission coefficient of the balun filter 302 may be referred to FIG. 4 and FIG. 5. As shown in FIG. 4 and FIG. 5, the reflection coefficient of the balun filter 302 is smaller than −15 dB around 24 GHz, and the transmission coefficient of the balun filter 302 is close to 0 dB around 24 GHz, such that the reflection loss is effectively reduced, the impedance matching is greatly enhanced, and the single-end signal is effectively converted into differential signals.

Figure 6:
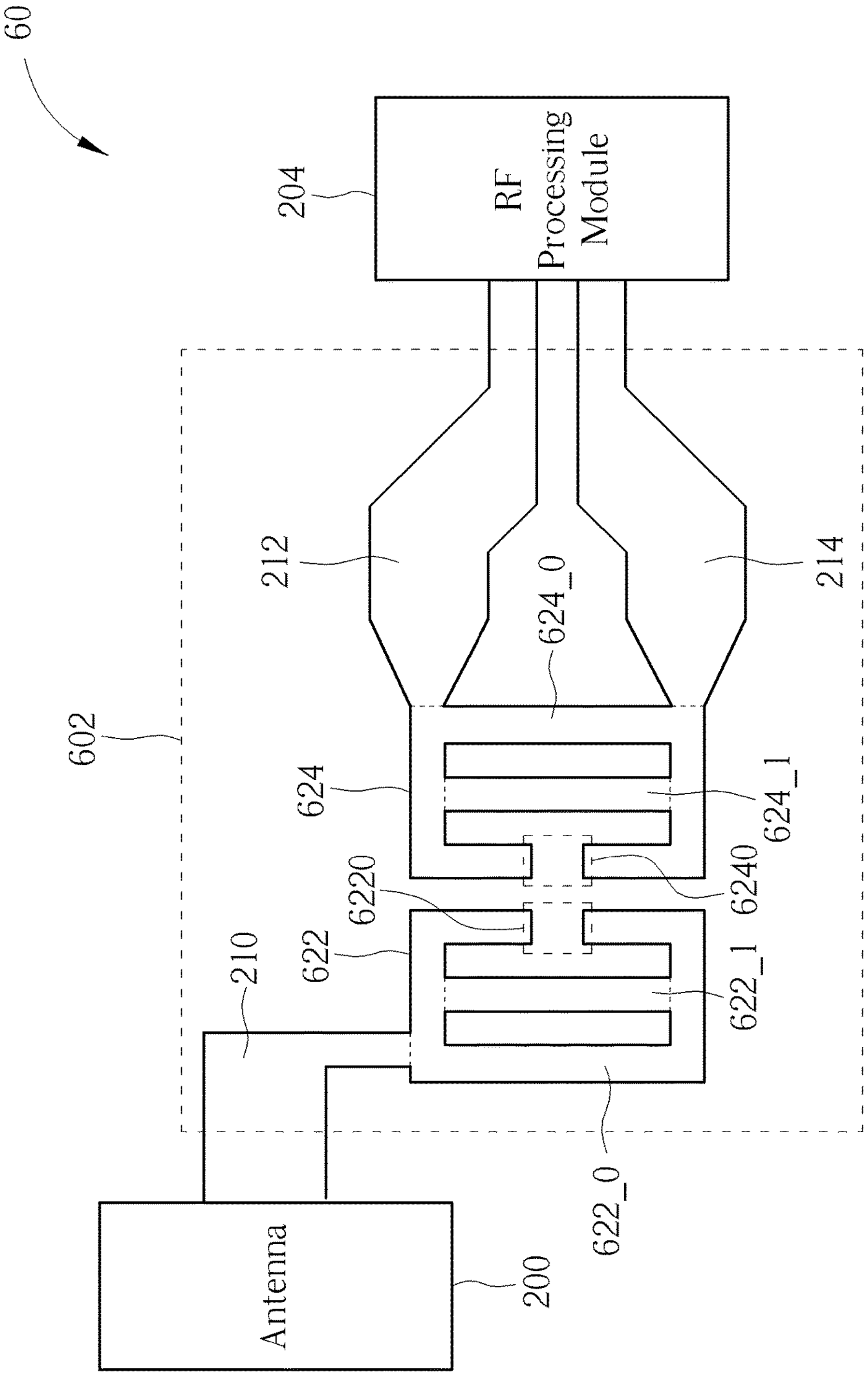
FIG. 6 is a schematic diagram of a radio-frequency system according to an embodiment of the present invention.
Figure 7:
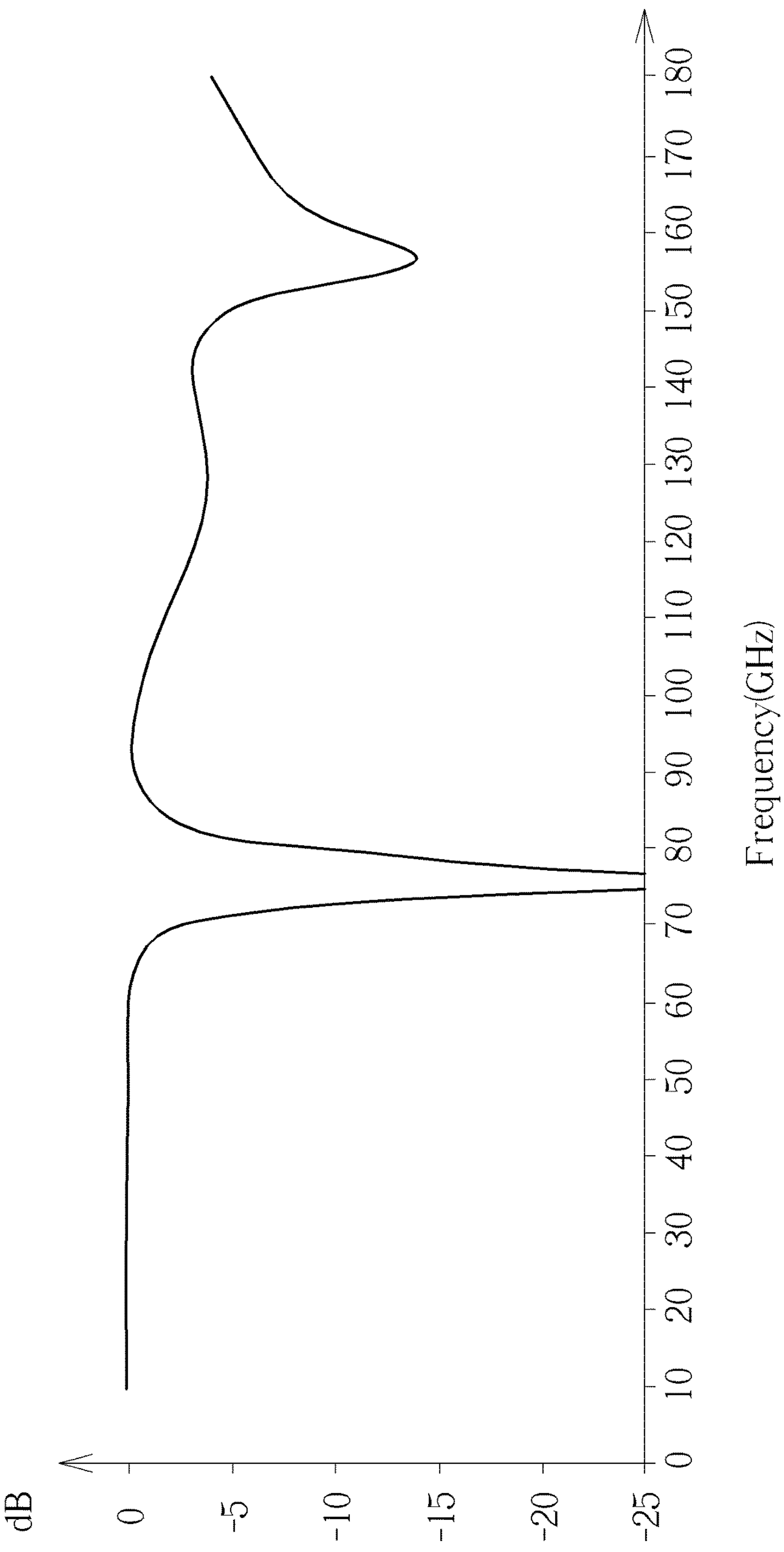
FIG. 7 is a schematic diagram of frequency responses of a reflection coefficient of the balun filter in FIG. 6.
Figure 8:
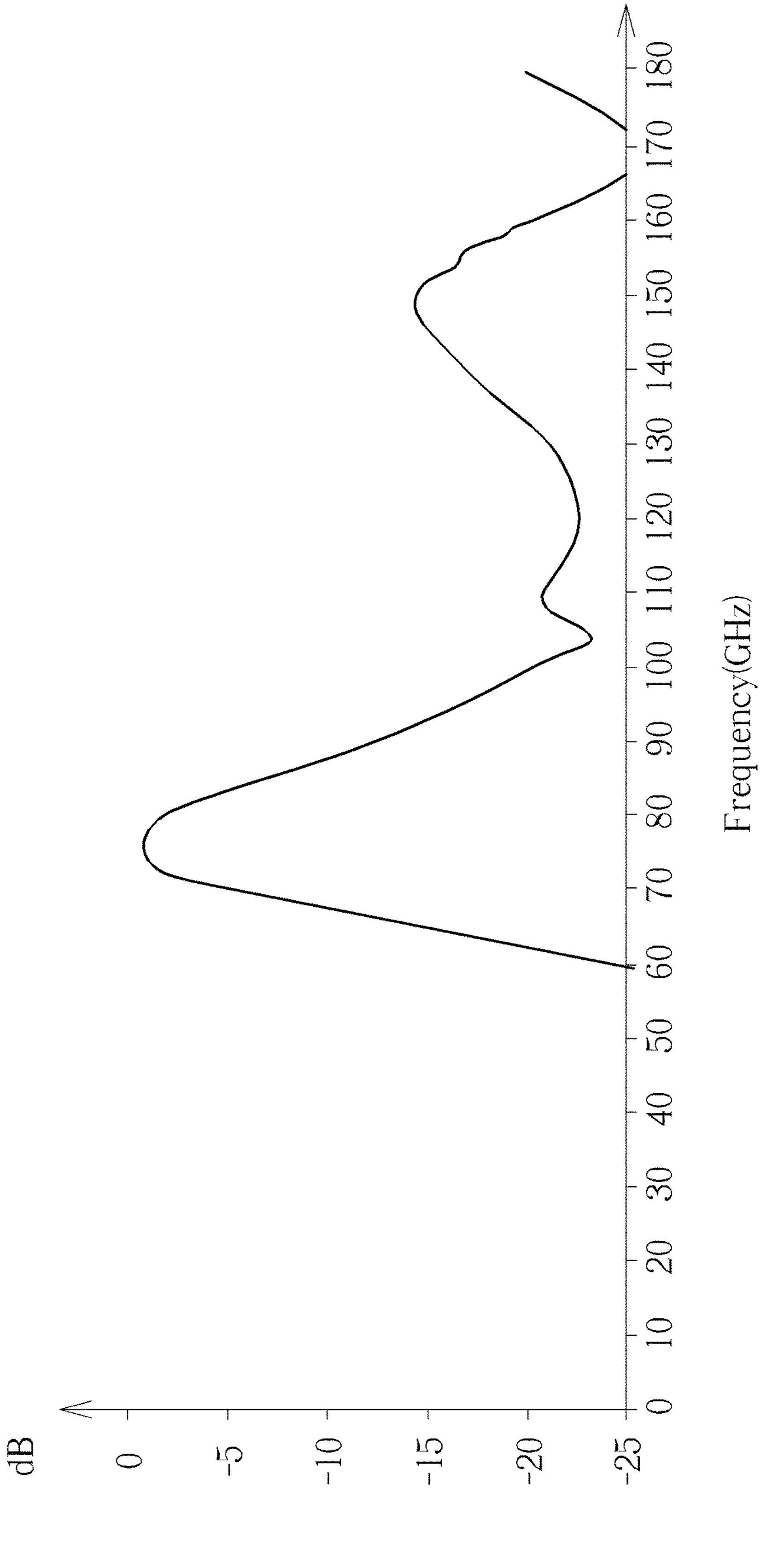
FIG. 8 is a schematic diagram of frequency responses of a transmission coefficient of the balun filter in FIG. 6.

In another perspective, the central frequency of the balun filter may be adjusted by changing the number of line segments within the area surrounded by the surrounding line. For example, FIG. 6 is a schematic diagram of an RF system 60 according to an embodiment of the present invention. An operational frequency of the RF system 60 is substantially 77 GHz. The RF system 60 and the RF system 20 have similar structures, and thus, same components are denoted by the same numerals. Different from the RF system 20, resonators 622, 624 in a balun filter 602 of the RF system 60 includes line segments 622_1, 624_1. It means that each area surrounded by surrounding lines 622_0, 624_0 contains only one segment, so as to satisfy the resonant condition for the balun filter 602 of which operational frequency is substantially at 77 GHz. Frequency responses of a reflection coefficient and a transmission coefficient of the balun filter 602 may be referred to FIG. 7 and FIG. 8. As shown in FIG. 7 and FIG. 8, the reflection coefficient of the balun filter 602 is smaller than −15 dB around 77 GHz, and the transmission coefficient of the balun filter 602 is close to 0 dB around 77 GHz, such that the reflection loss is effectively reduced, the impedance matching is greatly enhanced, and the single-end signal is effectively converted into differential signals.

Figure 9:
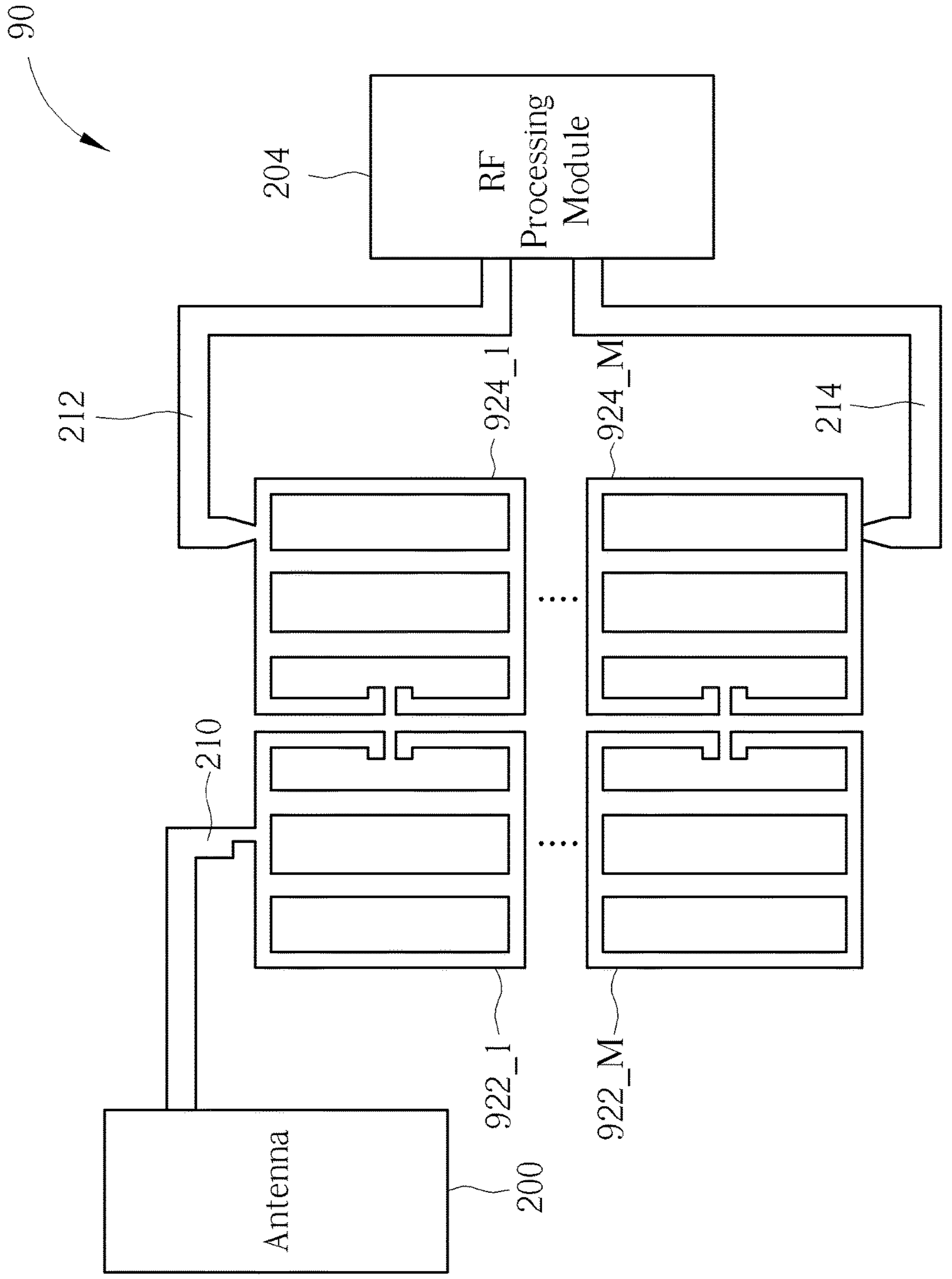
FIG. 9 is a schematic diagram of a radio-frequency system according to an embodiment of the present invention.

Notably, the embodiments mentioned above are merely utilized for illustrating concepts of the present invention. Those skilled in the art may make modifications and alternations accordingly. For example, the shape of the area surrounded by the surrounding line should not be limited to rectangular. The surrounding line may include arcs or sections, such that the area surrounded by the surrounding line may have different shapes, as long as the resonator is symmetric with respect to the horizontal central line, which satisfies the requirements of the present invention. In addition, the two resonators of the band pass filter are not limited to be the same shape. The two resonators may be different shapes or structures, as long as the two resonators are symmetric with respect to the horizontal central line, which satisfies the requirements of the present invention. Furthermore, in the embodiments mentioned the above, the two resonators in the band pass filter are arranged as a 1×2 array, but are not limited thereto. The band pass filter may include more than two resonators and extend towards the vertical direction. For example, FIG. 9 is a schematic diagram of an RF system 90 according to an embodiment of the present invention. The band pass filter of the RF system 90 includes resonators 922_1~922_M, 924_1~924_M, which are arranged as an M×2 array, where M is an integer greater than 1. As long as the band pass filter has vertically symmetric structure, the requirements of the present invention are satisfied.

In the prior art, the balun converter and the band pass filter are individually designed and connected together in series. The impedance matching problem between the balun converter and the band pass filter needed to be solved. Larger circuit area is needed. The loss on transmission path is increased and the antenna gain is reduced. In comparison, the balun filter of the present invention combines the balun converter and the band pass filter as a single functional block, avoiding the impedance matching problem. The loss on transmission path is reduced, the antenna gain is enhanced, and the required circuit area is smaller.

In summary, the balun filter of the present invention adjusts the feed-in location of the band pass filter to achieve the input impedance of the differential-mode half-circuit being zero, so as to achieve impedance matching, and adjusts the feed-in location of the band pass filter to achieve the input impedance of the common-mode half-circuit being twice of a characteristic impedance, so as to achieve balanced output. Moreover, the band pass filter of the balun filter is a fence-type filter, which means that the central frequency and bandwidth of the band pass filter are adjusted by changing the number of line segments and gaps between the line segments within the fence-type filter. Therefore, the balun filter of the present invention has the functions of balun converter and band pass filter, such that the disposal area of the RF system is effectively reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A balun filter, utilized for a radio-frequency (RF) system, comprising:

a first terminal, coupled to an antenna of the RF system, for delivering an RF signal;

a differential port, comprising a second terminal and a third terminal, for delivering a differential signal; and a band pass filter, coupled between the first terminal and the differential port, the band pass filter comprising a plurality of resonators, wherein each of the plurality of resonators comprises:

a surrounding line, substantially surrounding an area, and forming a loophole on a side of the resonator; and at least one line segment, connected to the surrounding line, and disposed separately within the area surrounded by the surrounding line;

wherein the band pass filter is symmetric with respect to a central line penetrating through the loophole.

2. The balun filter of claim 1, wherein a number of the at least one line segment is related to a central frequency of the band pass filter.

3. The balun filter of claim 1, wherein the first terminal is coupled to the band pass filter at a feed-in location, and the feed-in location is related to an energy ratio and a phase difference of signals at the second terminal and the third terminal.

4. The balun filter of claim 1, wherein signals at the second terminal and the third terminal have equal energy and opposite phases.

5. The balun filter of claim 1, wherein a common mode input impedance of the band pass filter is substantially zero, and a differential mode input impedance of the band pass filter is substantially a multiple of a characteristic impedance.

6. The balun filter of claim 1, wherein the plurality of resonators are arranged as an M×2 array.

7. The balun filter of claim 6, wherein each row of the plurality of resonators comprises a first resonator and a second resonator, the first resonator and the second resonator are separated from each other, a loophole of the first resonator and a loophole of the second resonator are aligned with each other, and the first resonator and the second resonator are symmetric to each other.

8. A radio-frequency (RF) system, comprising:

an antenna, for transmitting or receiving a RF signal;

a balun filter, comprising:

a first terminal, coupled to an antenna of the RF system, for delivering an RF signal;

a differential port, comprising a second terminal and a third terminal, for delivering a differential signal; and a band pass filter, coupled between the first terminal and the differential port, the band pass filter comprising a plurality of resonators, wherein each of the plurality of resonators comprising:

a surrounding line, substantially surrounding an area, and forming a loophole on a side of the resonator; and at least one line segment, connected to the surrounding line, and disposed separately within the area surrounded by the surrounding line;

wherein the band pass filter is symmetric with respect to a central line penetrating through the loophole; and an RF processing module, coupled to the differential port, for receiving or generating the differential signal.

9. The RF system of claim 8, wherein a number of the at least one line segment is related to a central frequency of the band pass filter.

10. The RF system of claim 8, wherein the first terminal is coupled to the band pass filter at a feed-in location, and the feed-in location is related to an energy ratio and a phase difference of signals at the second terminal and the third terminal.

11. The RF system of claim 8, wherein signals at the second terminal and the third terminal have equal energy and opposite phases.

12. The RF system of claim 8, wherein a common mode input impedance of the band pass filter is substantially zero, and a differential mode input impedance of the band pass filter is substantially a multiple of a characteristic impedance.

13. The RF system of claim 8, wherein the plurality of resonators are arranged as an M×2 array.

14. The RF system of claim 13, wherein each row of the plurality of resonators comprises a first resonator and a second resonator, the first resonator and the second resonator are separated from each other, a loophole of the first resonator and a loophole of the second resonator are aligned with each other, and the first resonator and the second resonator are symmetric to each other.

* * * * *